(12) United States Patent
Shelton et al.

(10) Patent No.: US 7,084,475 B2
(45) Date of Patent: Aug. 1, 2006

(54) LATERAL CONDUCTION SCHOTTKY DIODE WITH PLURAL MESAS

(75) Inventors: Bryan S. Shelton, Bound Brook, NJ (US); Linlin Liu, Hillsborough, NJ (US); Alex D. Ceruzzi, Princeton Junction, NJ (US); Michael Murphy, Somerset, NJ (US); Milan Pophristic, North Brunswick, NJ (US); Boris Peres, Jersey City, NJ (US); Richard A. Stall, Belle Mead, NJ (US); Xiang Gao, Edison, NJ (US); Ivan Eliashevich, Maplewood, NJ (US)

(73) Assignee: Velox Semiconductor Corporation, Somerset, NJ (US)

( * ) Notice: Subject to any disclaimer, the term of this patent is extended or adjusted under 35 U.S.C. 154(b) by 47 days.

(21) Appl. No.: 10/780,363

(22) Filed: Feb. 17, 2004

(65) Prior Publication Data

US 2005/0179104 A1   Aug. 18, 2005

(51) Int. Cl.
*H01L 29/47* (2006.01)
(52) U.S. Cl. .................. 257/471; 257/280; 257/485; 257/281; 438/167; 438/92; 438/173
(58) Field of Classification Search ............... None
See application file for complete search history.

(56) References Cited

U.S. PATENT DOCUMENTS

| | | | |
|---|---|---|---|
| 3,775,200 A | 11/1973 | de Nobel et al. | |
| 4,745,445 A | 5/1988 | Mun et al. | |
| 5,602,418 A | 2/1997 | Imai et al. | |
| 5,877,558 A | 3/1999 | Nakamura et al. | |
| 6,184,570 B1 | 2/2001 | MacDonald, Jr. et al. | |
| 6,331,450 B1 | 12/2001 | Uemura | |
| 6,344,665 B1 | 2/2002 | Sung et al. | |
| 6,380,108 B1 | 4/2002 | Linthicum et al. | |
| 6,437,374 B1 | 8/2002 | Northrup et al. | |
| 6,507,041 B1 | 1/2003 | Nakamura et al. | |
| 6,524,900 B1 | 2/2003 | Dahlqvist et al. | |

(Continued)

OTHER PUBLICATIONS

Yanagihara, et al., "Development of GaN-Based Electronic Device on Si", Sanken Technical Report, vol. 35, No. 1 (2003), pp. 11-14, Japan (English—language translation of Japanese—language publication).

*Primary Examiner*—Nathan J. Flynn
*Assistant Examiner*—Scott R Wilson
(74) *Attorney, Agent, or Firm*—Lerner, David, Littenberg, Krumholz & Mentlik, LLP

(57) ABSTRACT

A lateral conduction Schottky diode includes multiple mesa regions upon which Schottky contacts are formed and which are at least separated by ohmic contacts to reduce the current path length and reduce current crowding in the Schottky contact, thereby reducing the forward resistance of a device. The multiple mesas may be isolated from one another and have sizes and shapes optimized for reducing the forward resistance. Alternatively, some of the mesas may be finger-shaped and intersect with a central mesa or a bridge mesa, and some or all of the ohmic contacts are interdigitated with the finger-shaped mesas. The dimensions of the finger-shaped mesas and the perimeter of the intersecting structure may be optimized to reduce the forward resistance. The Schottky diodes may be mounted to a submount in a flip chip arrangement that further reduces the forward voltage as well as improves power dissertation and reduces heat generation.

77 Claims, 5 Drawing Sheets

U.S. PATENT DOCUMENTS

| | | |
|---|---|---|
| 6,573,537 B1 | 6/2003 | Steigerwald et al. |
| 6,586,777 B1 | 7/2003 | Yuasa et al. |
| 6,586,781 B1 | 7/2003 | Wu et al. |
| 6,593,597 B1 | 7/2003 | Sheu |
| 6,605,854 B1 | 8/2003 | Nagase et al. |
| 6,608,327 B1 | 8/2003 | Davis et al. |
| 6,610,995 B1 | 8/2003 | Nakamura et al. |
| 6,624,444 B1 * | 9/2003 | Li .................................. 257/59 |
| 6,627,967 B1 * | 9/2003 | Asano et al. ................ 257/472 |
| 2001/0034116 A1 | 10/2001 | Lee et al. |
| 2003/0015708 A1 | 1/2003 | Parikh et al. |
| 2003/0062525 A1 | 4/2003 | Parikh et al. |
| 2003/0075728 A1 | 4/2003 | Tooi et al. |
| 2005/0127465 A1 * | 6/2005 | Chiola ......................... 257/471 |

* cited by examiner

LATERAL CONDUCTION SCHOTTKY DIODE WITH PLURAL MESAS

BACKGROUND OF THE INVENTION

The present invention is directed to semiconductor devices and, more particularly, to Schottky diode structures and assemblies.

Schottky diodes are desired for applications where energy losses while switching from forward bias to reverse bias and back can significantly impact the efficiency of a system and where high current conduction is desired under forward bias and little or no conduction is desired under reverse bias, such as when used as an output rectifier in a switching power supply. The Schottky diodes have lower turn-on voltages because of the lower barrier height of the rectifying metal-to-semiconductor junction and have faster switching speeds because they are primarily majority carrier devices.

Presently, most Schottky diodes are silicon-based, vertical conduction devices. In such devices, a Schottky metallic contact is formed on one surface of a silicon body, an ohmic metallic contact is formed on an opposite surface of the silicon body, and when the device is forward biased, current flows vertically across the silicon body from the Schottky metallic contact to the ohmic metallic contact. Silicon-based Schottky diodes have the disadvantage, however, that silicon has a low carrier mobility and a relatively narrow band gap. Further, for higher voltage applications, a thick, low doped base must be used which leads to higher series resistance, a greater forward voltage drop, and increased heat dissipation, thereby making silicon-based Schottky diodes unsuitable for such applications. Moreover, at higher temperatures, the reverse leakage current increases dramatically and negates the rectification properties of the device.

To avoid the problems inherent in silicon-based devices, Schottky diodes made of materials having a higher electron mobility, wider band gap and higher breakdown voltage are desired. Such materials include diamond, silicon carbide, nitride-based semiconductors and other composite materials. These materials, however, are typically formed atop an insulating substrate, and therefore Schottky diodes formed using such materials require a lateral conduction path rather than a vertical conduction path. Devices having a lateral conduction path, however, are prone to high on-resistances when the device is forward-biased because the forward current must travel over a relatively long conduction path determined by the horizontal dimensions of the device. The current must also travel along relatively thin layers of materials having a small cross-sectional area in the direction transverse to the direction of current flow. Moreover, because the forward current flows laterally from the Schottky metallic contact to the ohmic metallic contact, current flow away from the Schottky metallic contact is often non-uniformly distributed so that the current density is crowded along the edge of the contact. The electrically insulating substrate of the lateral conducting Schottky diode is also typically a poorer thermal conductor and thus dissipates heat less efficiently than vertical devices. The poorer heat dissipation increases the complexity of the device packaging because alternative ways of heat removal must be employed. Additionally, the device packaging is further complicated by the presence of both the Schottky metallic contact and the ohmic metallic contact on the same side of the laterally conducting device which requires more complex interconnections than those of vertically conducting devices in which the contacts are on opposite sides.

It is therefore desirable to provide a laterally conducting Schottky diode structure and assembly that provides the advantages of higher electron mobility and wider band gap materials but which are less prone to higher on-resistance, non-uniform current distribution, and poorer thermal conduction and which does not require complex packaging.

SUMMARY OF THE INVENTION

A Schottky diode is provided in accordance with an aspect of the invention. A semiconductor body includes a lower semiconductor layer and an upper semiconductor layer formed atop a portion of the lower semiconductor layer. The lower semiconductor layer and the upper semiconductor layer are of a same conductivity type, and the lower semiconductor layer is more highly doped than the upper semiconductor layer. The semiconductor body defines a lower contact surface and a plurality of mesas projecting upwardly from the lower contact surface. The lower contact surface includes at least a portion of the lower layer. Each of the mesas includes a portion of the upper layer and defines an upper contact surface. Each mesa is separated from adjacent mesas by a portion of the lower contact surface. A plurality of upper metallic contacts are each disposed atop a respective one of the plurality of mesas and form a respective Schottky contact with the upper surface of that mesa. One or more lower metallic contacts are disposed on the lower contact surface in substantially ohmic contact therewith. At least part of the one or more lower metallic contacts extend between at least some of the mesas.

In accordance with the aspect of the invention, the mesas may include a portion of the lower layer. The one or more lower metallic contacts include one or more continuous regions that each extend between one or more mesas.

A Schottky diode is provided in accordance with another aspect of the invention. A semiconductor body includes a lower semiconductor layer and an upper semiconductor layer formed atop a portion of the lower semiconductor layer. The lower semiconductor layer and the upper semiconductor layer are of the same conductivity type. The lower semiconductor layer is more highly doped than the upper semiconductor layer. The semiconductor body defines a lower contact surface and a plurality of mesas projecting upwardly from the lower contact surface. The lower contact surface includes a portion of the lower layer. Each of the plurality of mesas includes a portion of the upper layer and a further portion of the lower layer. Each mesa defines an upper contact surface and is separated from adjacent ones of the mesas by a portion of the lower contact surface. A plurality of upper metallic contacts is each disposed atop a respective one of the plurality of mesas and forms a respective Schottky contact with the upper contact surface of that mesa. One or more lower metallic contacts are disposed on the lower contact surface in substantially ohmic contact therewith.

In accordance with this aspect of the invention, the distance between a top surface of the one or more of lower metallic contacts and the lower contact surface may be less than the distance between a bottom surface of the upper layer and the lower contact surface.

In accordance with the above aspects of the invention, a size of each of the mesas may be selected such that a forward operating voltage of the Schottky diode is minimized. Each of the plurality of upper metallic contacts may include a contact metal layer that forms a respective Schottky contact with the upper contact surface and may include a bond pad metal layer that is disposed atop the contact metal layer.

Each of the one or more lower metallic contacts may include a contact metal layer that forms the ohmic contact with the lower contact surface and a bond pad metal layer that is disposed atop the contact metal layer. One or both of the upper semiconductor layer and the lower semiconductor layer may include a nitride-based semiconductor, a gallium nitride-based semiconductor and/or GaN. The lower and upper semiconductor layers may be n-type.

At least some of the mesas may intersect with at least another of the mesas and define a shape having a convoluted perimeter. The perimeter may be at least two times a perimeter of the smallest theoretical rectangle enclosing the shape. At least some of the mesas may intersect with at least another of the mesas and define a shape having a main portion and a plurality of extensions extending from the main portion, and the plurality of extensions may be interdigitated with regions of the lower contact surface. At least one bridge may extend from the main portion, and a plurality of extensions may extend from the bridge. The main portion may be elongated at least in a first direction, and at least some of the plurality of extensions may be elongated in a second direction transverse to the first direction. The bridge may also be elongated at least in the first direction. At least some of the extensions have a length-to-width ratio of at least about 2:1. At least one of the upper metallic contacts may be disposed atop the main portion. At least some of the upper metallic contacts are disposed atop at least some of the plurality of extensions and are electrically connected with one another, and at least part of the one or more lower metallic contacts extends between at least some of the plurality of extensions.

A diode assembly may include a Schottky diode in accordance with one of the above aspects of the invention with one or more first conductors electrically connected to at least some of the plurality of upper metallic contacts and one or more second conductors electrically connected to one or more of the one or more lower metallic contacts. The one or more first conductors may be electrically connected to all of the upper metallic contacts, and the one or more second conductors may be electrically connected to all of the one or more lower metallic contacts. One or more second conductors may be electrically connected to each of the one or more continuous regions at a plurality of spaced-apart connection points. At least some of the connection points may be disposed away from the mesas. At least some of the connection points may be disposed between at least some of the mesas. The one or more first conductors and the one or more second conductors may include interconnect bumps.

The diode assembly may include a submount that includes a submount substrate, one or more first submount contacts that are each electrically connected to one or more of one or more first conductors and exposed at a front surface of the submount substrate, and one or more second submount contact pads that are each electrically connected to one or more of the one or more second conductors and exposed at the front surface of the submount substrate with the semiconductor body being mounted on the front surface of the submount substrate in a flip-chip arrangement such that the first submount contacts are connected to the upper contacts and the second submount contacts are connected to the one or more lower contacts. The submount structure may include a first terminal and a second terminal each disposed on the front surface of the submount substrate and configured to provide connections external to the assembly with the first submount contacts being electrically connected to the first terminal and the second submount contacts being electrically connected to the second terminal. A first terminal and a second terminal may be each disposed on a back surface of the submount substrate and configured to provide connections external to the assembly with the first submount contacts being electrically connected to the first terminal and the second submount contact being electrically connected to the second terminal. At least a first conducting via may extend through the submount substrate and electrically connect each of the submount contacts with the first terminal, and at least a second conducting via may extend through the submount substrate and electrically connect each second submount connect with the second terminal. A first common terminal and a second common terminal may each be disposed on the front surface of the submount substrate with the first common terminal electrically connecting the first submount contact to the first conducting via and the second common terminal electrically connecting the one or more second submount contacts to the second conducting via.

A submount structure is provided in accordance with yet another aspect of the invention. One or more first submount contacts are each exposed at a front surface of the submount substrate. A first common terminal is disposed on the front surface of the submount substrate and is electrically connected to each submount contact. At least a first connecting via extends from the front surface of the submount substrate to a back surface of the submount substrate and is electrically connected to the first common terminal. A first further terminal is disposed on the back surface of the submount substrate, is configured to provide connections external to the submount substrate and is electrically connected to the first conducting via. One or more second submount contact pads are each exposed at the front surface of the submount substrate. A second common terminal is disposed on the front surface of the submount substrate and is electrically connected to the one or more submount contacts. At least a second conducting via extends from the front surface of the submount substrate to the back surface of the submount substrate and is electrically connected to the second common terminal. A second further terminal is disposed on the back surface of the submount substrate, is configured to provide connections external to the submount structure, and is electrically connected to the second conducting via.

A Schottky diode is provided in accordance with still another aspect of the invention. A semiconductor body includes a lower semiconductor layer and an upper semiconductor layer formed atop a portion of the lower semiconductor layer. The lower semiconductor layer and the upper semiconductor layer are of a same conductivity type with the lower semiconductor layer being more highly doped than the upper semiconductor layer. The semiconductor body defines a lower contact surface and a first mesa projecting upwardly from the main surface. The first mesa includes at least a portion of the upper layer and defines an upper contact surface. The first mesa includes at least a portion of the upper layer and defines an upper contact surface. The first mesa includes a main portion, at least one bridge extending from the main portion, and a plurality of extensions extending from the main portion or from the bridge. The plurality of extensions are interdigitated with regions of a lower contact surface. The main portion and the bridge are elongated at least in a first direction and at least some of the extensions are elongated in a second direction transverse to the first direction. At least some of the extensions have length-to-width of at least about 2:1. One or more metallic contacts are disposed atop the first mesa and form a Schottky contact with the upper contact surface of the first mesa. One or more lower metallic contacts are disposed on the lower contact surface in substantially ohmic contact therewith. At least part of the one or more lower metallic contacts extend between at least some of the plurality of extensions.

In accordance with this aspect of the invention, the first mesa has a perimeter of at least two times the perimeter of the smallest theoretical rectangle closing the first mesa. One or both of the upper semiconductor layer and the lower semiconductor layer includes a nitride-based semiconductor, a gallium nitride-based semiconductor, and/or GaN.

In further accordance with the invention, a Schottky diode is formed to have the features described above.

The foregoing aspects, features and advantages of the present invention will be further appreciated when considered with reference to the following description of the preferred embodiments and accompanying drawings.

DETAILED DESCRIPTION

Figure 1:
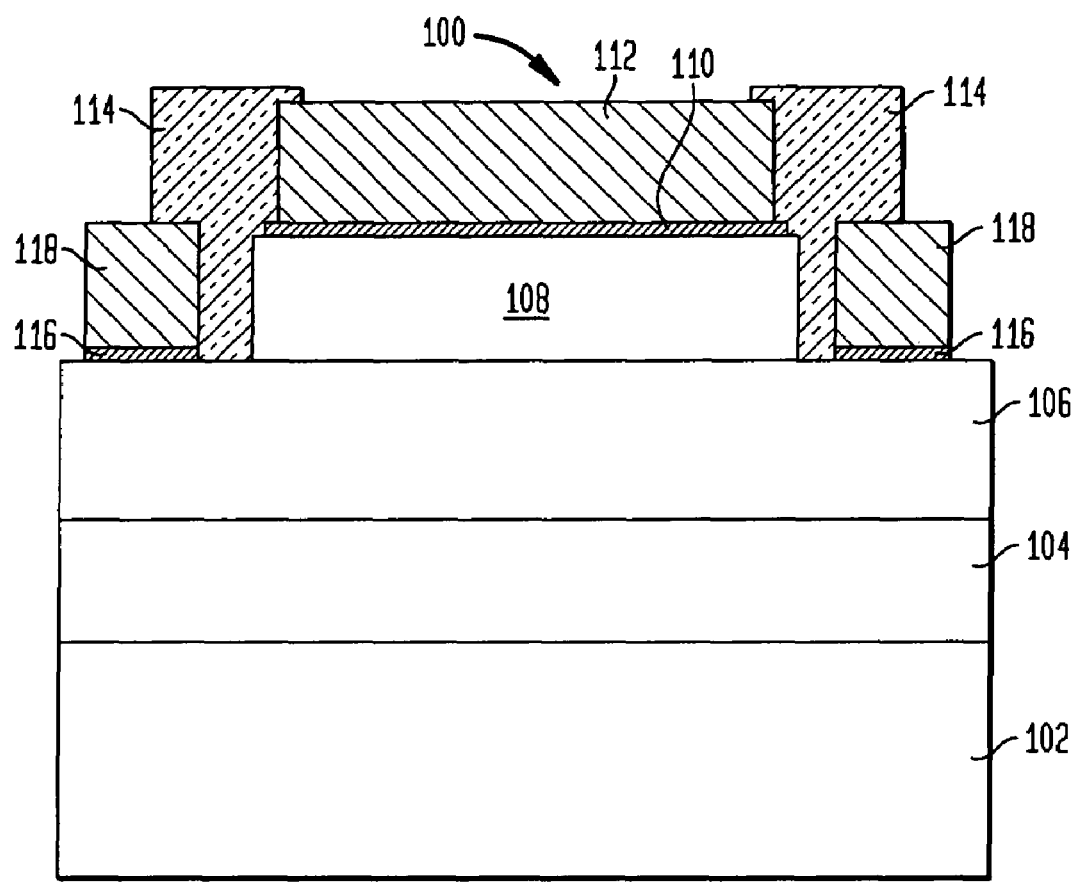
FIG. 1 is a fragmentary, diagrammatic sectional view on an enlarged scale showing a known laterally conducting Schottky diode.

FIG. 1 illustrates a cross-sectional view of a known laterally conducting Schottky diode 100. The Schottky diode includes an electrically insulating substrate 102 that is typically a poor thermal conductor. A buffer layer 104 may be provided atop the substrate 102, and a highly doped semiconductor layer 106 is located atop the buffer layer 104 or, when the buffer layer is not present, directly atop the substrate 102. A lower doped semiconductor layer 108 is disposed atop a portion of the more highly doped semiconductor layer 106, and a Schottky metal contact 110 is located atop the lower doped semiconductor layer 108 and forms a metal-to-semiconductor junction with the lower doped layer. An ohmic metal contact is disposed atop the exposed portion of the highly doped layer 106. A thicker bond pad metal layer 112 is disposed atop the Schottky metal contact 110 and a further bond pad metal layer 118 is disposed atop the ohmic metal contact 116. A passivation layer 114 may be formed at least between the ohmic metal layer and its bond pad metal layer and the Schottky metal layer and its bond pad metal layer.

The known Schottky diode 100 is configured to laterally conduct current through the semiconductor layers to carry the forward current. The forward current travels vertically from the Schottky metal contact 110 through the relatively thin lower doped layer 108 and then traverses along the horizontal dimension of the highly doped layer 106 to the ohmic metal layer 116. Thus, the forward current must travel over a relatively long path of the horizontal dimension of the highly doped layer 106. The layer 106 is also a relatively thin layer having small cross-sectional area in the direction transverse to the direction of current flow. The resulting path length may be a millimeter or more whereas the thickness of the layer is about a few microns. As a result, the known Schottky diode 100 has a relatively high on-resistance.

Figure 2A:
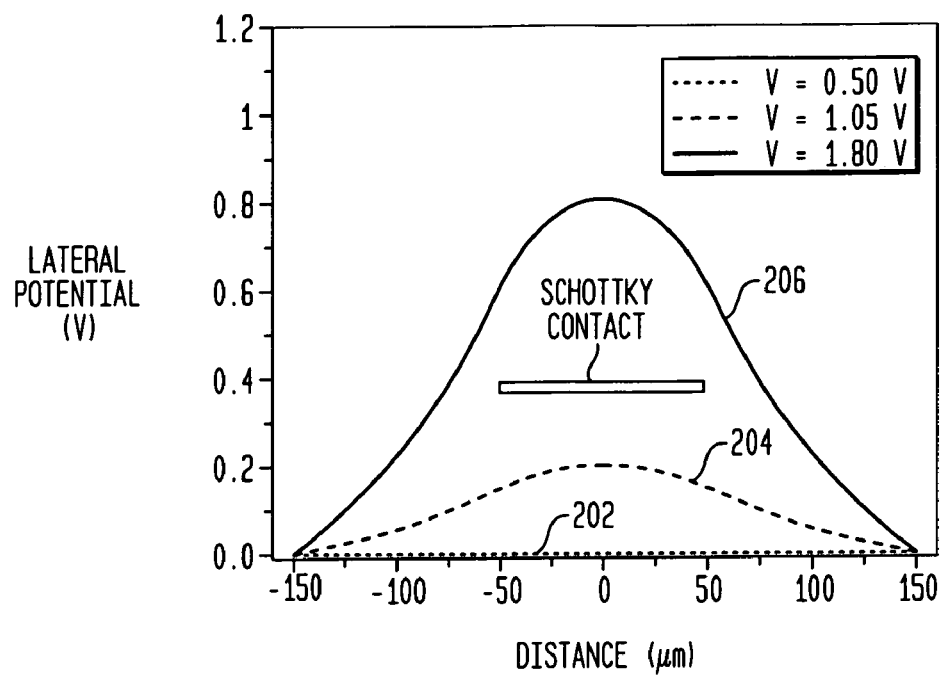
FIGS. 2A and 2B are diagrams illustrating the relation between the lateral potential distribution and the current density distribution, respectively, of the known laterally conducting Schottky diode as a function of increasing distance from the center of a Schottky metallic contact.

FIG. 2A illustrates the forward-bias lateral potential distribution across the width of the Schottky diode as plotted from the center of the Schottky contact 110 outward in each direction towards the edge of the device. At lower voltages, as curve 202 shows, the potential distribution is constant across the device. However, at increasingly higher applied voltages, the difference in potential between the center of the device and the edges of the device increases because of the increased laterally conducted current in the highly doped layer 108 and the associated increase in on-resistance, as curves 204 and 206 show.

Figure 2B:
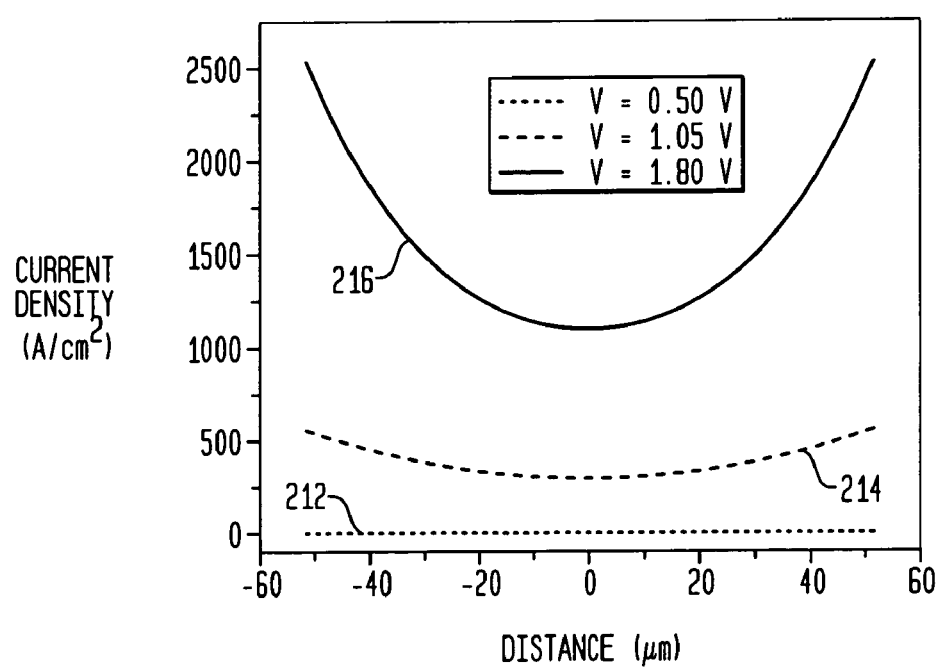

Additionally, the wide lateral dimension of the Schottky contact 110 results in non-uniformly distributed current across the device so that the current density is crowded along the edge of the Schottky contact. FIG. 2B illustrates the device current density distribution across the width of the Schottky contact. For lower applied voltages, the current crowding is not noticeable, as curve 212 shows. However, the current density at the edges becomes higher than at the center of the Schottky contact as the applied voltage increases, as curve 214 shows. For sufficiently high voltages, as curve 216 shows, the increase current density at the edges of the Schottky contact become so significant that the current crowding renders the device unsuitable.

Figure 3A:
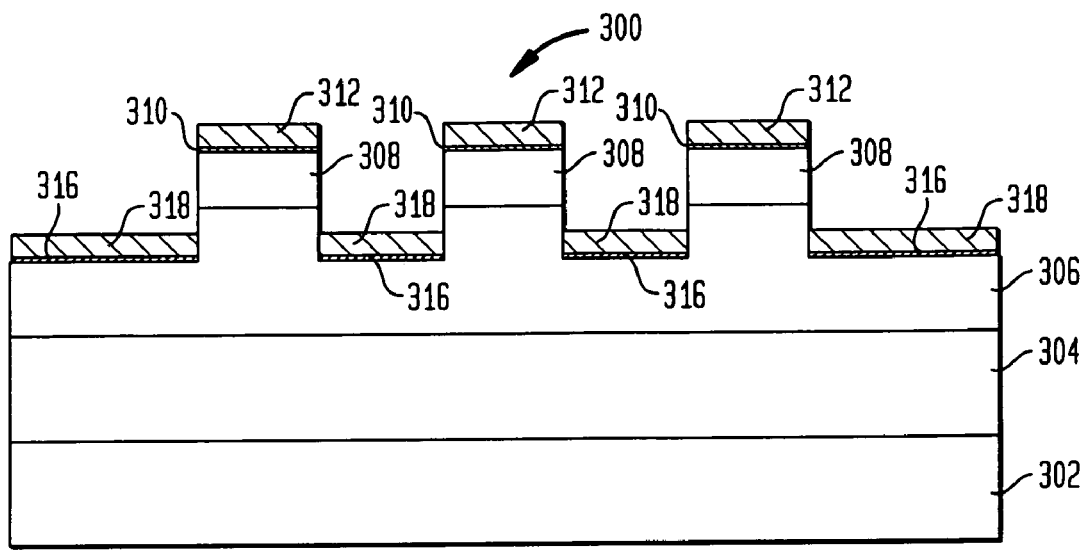
FIG. 3A is a fragmentary, cross-sectional view on an enlarged scale of a laterally conducting Schottky diode in accordance with an embodiment of the invention.

FIG. 3A illustrates a cross-sectional view of a laterally conducting Schottky diode in accordance with an embodiment of the invention. The Schottky diode 300 includes a substrate 302 upon which further layers are grown. Ideally, the substrate should have a lattice spacing, namely the spacing between adjacent atoms in its crystal lattice, that is equal to that of the semiconductor materials that are to be grown atop the substrate to reduce the number of defects, such as dislocations in the crystal lattice, that are formed in the semiconductor. Additionally, it is also highly desirable for the substrate to have a thermal expansion coefficient at least equal that of the semiconductor material so that when the substrate and semiconductor material are cooled after the growth of the semiconductor layer, the substrate will contract more than the semiconductor layer, thereby compressing the semiconductor layer and avoiding the formation of cracks in the layer.

The substrate 302 is typically an insulating or non-conducting substrate that is used to form a laterally conducting device. To compensate for the lattice mismatch and the thermal expansion coefficient mismatch between the semiconductor layers and the substrates, a buffer layer 304 may be provided atop the substrate 302. When the semiconductor material that is to be subsequently grown is a nitride-based semiconductor, such as gallium nitride (GaN) or a gallium nitride-based material, for example, the substrate may be a crystalline sapphire wafer, silicon carbide wafer or undoped silicon wafer and the buffer layer may be comprised of one or more layers of nitride-based materials to provide a transition between the lattice structure of the substrate and the lattice structure of the gallium nitride or other nitride-based semiconductor layer.

As used in the present disclosure, the term "III–V semiconductor" refers to a compound semiconductor material according to the stoichiometric formula $Al_aIn_bGa_cN_dAs_eP_f$ where (a+b+c) is about 1 and (d+e+f) is also about 1. The term "nitride semiconductor" or "nitride-based semiconductor" refers to a III–V semiconductor in which d is 0.5 or more, most typically about 0.8 or more. Preferably, the semiconductor materials are pure nitride semiconductors, i.e., nitride semiconductors in which d is about 1.0. The term "gallium nitride based semiconductor" as used herein refers to a nitride semiconductor including gallium, and most preferably including gallium as the principal metal present, i.e., having $c \geq 0.5$ and most preferably $\geq 0.8$. The semiconductors may have p-type or n-type conductivity, which may be imparted by conventional dopants and may also result from the inherent conductivity type of the particular semiconductor material. For example, gallium nitride-based semiconductors having defects typically are inherently n-type even when undoped. Conventional electron donor dopants such as Si, Ge, S, and O, can be used to impart n-type conductivity to nitride semiconductors, whereas p-type nitride semiconductors may include conventional electron acceptor dopants such as Mg and Zn.

A highly doped semiconductor layer 306, which may be a nitride-based semiconductor such as gallium nitride or gallium nitride-based semiconductor, is then formed atop the buffer layer 304 or, when the buffer layer is not present, directly atop the substrate 302. The highly doped layer 306 is typically formed using an epitaxial growth process. A reactive sputtering process may be used where, when the layer 306 is a nitride-based semiconductor, the metallic constituents of the semiconductor, such as gallium, aluminum and/or indium, are dislodged from a metallic target disposed in close proximity to the substrate while both the target and the substrate are in a gaseous atmosphere that includes nitrogen and one or more dopants. Alternatively, metal organic chemical vapor deposition (MOCVD) is employed wherein, when the layer 306 is a nitride-based semiconductor, the substrate is exposed to an atmosphere containing organic compounds of the metals as well as to a reactive nitrogen-containing gas, such as ammonia, and a dopant-containing gas while the substrate is maintained at an elevated temperature, typically around 700–1100° C. The gaseous compounds decompose and form a doped semiconductor in the form of a film of crystalline material on the surface of the substrate 302. The substrate and the grown film are then cooled. As a further alternative, other epitaxial growth methods, such as molecular beam epitaxy (MBE) or atomic layer epitaxy may be used. When the resulting highly doped layer 306 is a nitride-based semiconductor, the layer preferably n-type with a doping concentration of at least 4E18 $cm^{-3}$.

A lower doped semiconductor layer 308, which may also be a nitride-based semiconductor such as gallium nitride or a gallium nitride-based semiconductor, is formed atop at least atop part of the highly doped layer 306. The lower doped layer 308 is typically grown epitaxially using methods such as the reactive sputtering, MOCVD, MBE or atomic layer epitaxy methods described above. When the lower doped layer is a nitride-based semiconductor, the layer is preferably ntype and preferably has a doping concentration of between 0.75E16 and 1.4E16 $cm^{-3}$. Modulation doping may be employed to form such a nitride-based semiconductor layer to attain such low doping levels in a repeatable and uniform manner, such as is described in U.S. patent application No. 10/780,526, filed Feb. 17, 2004, the disclosure of which is incorporated herein by reference.

Typically, the lower doped layer 308 is formed atop the entire surface of the higher doped layer 306, the lower doped layer 308 is then patterned, and part of the lower doped layer is etched away to expose regions of the higher doped layer 306 and form mesas out of portions of the lower doped layer 308. Preferably, an upper portion of the exposed regions of the higher doped layer 306 is also etched. Such patterning and etching steps may be carried out in a known manner.

A Schottky metal contact 310 is formed atop the mesas of the lower doped layer 308 in a known manner and forms the metal-to-semiconductor junction with the lower doped layer. When the lower doped layer 308 is an n-type GaN based semiconductor, the Schottky metal layer is typically comprised of a platinum (Pt) layer and a gold (Au) layer (Pt/Au), a palladium (Pd) layer and a gold layer (Pd/Au), or a nickel (Ni) layer and a gold layer (Ni/Au), though other high work function materials may be used to obtain the desired barrier height.

A further metal contact 316 is formed atop the exposed portions of the highly doped layer 306 and forms an ohmic contact with the highly doped layer. The ohmic metal contact 316 is located between at least some of the mesas. Preferably, the ohmic metal contact at least partially surrounds, and more preferably completely surrounds, some or all of the mesas. The ohmic metal contact is typically comprised of aluminum/titanium/platinum/gold (Al/Ti/Pt/Au) or titanium/aluminum/platinum/gold (Ti/Al/Pt/Au), though other combinations of metals may be used.

A thicker bond pad metal layer 312 is formed atop the Schottky metal contact 310. Another thicker bond pad metal layer 318 is formed atop the ohmic metal contact 316. The top of the layer 318 is located below the bottom of the lower doped layer 308 to prevent shorting between the lower doped layer 318 and the bond pad layer 318. The bond pad layer 318 and the ohmic metal contact 316 may also be spaced apart from the sidewalls of the mesas. The bond pad metal layer is typically a thick layer of aluminum (Al) or gold (Au).

The Schottky metal layer 310, the ohmic metal layer 306 and the bond pad metal layers 312, 318 may be formed using methods known in the art.

Figure 3B:
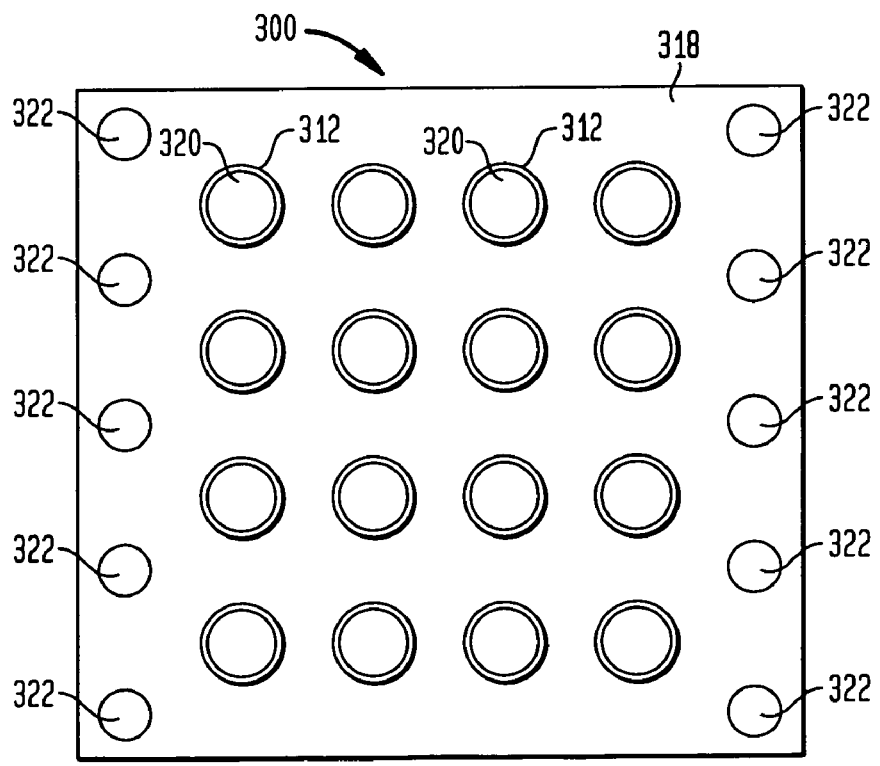
FIG. 3B is a fragmentary top view on an enlarged scale of the Schottky diode shown in FIG. 3A.

FIG. 3B illustrates a top view of the Schottky diode 300. The bond pad 312 and the underlying Schottky contact are located at the tops of the vertical mesas. The size of each mesa is optimized to attain as a constant current density across the mesa as possible, thereby minimizing the forward operating voltage. Though circular mesas are shown arranged in a regular pattern, other geometric shapes and other pattern arrangements are also within the scope of the invention. Additionally, though FIG. 3B shows the bond pad 318 and the ohmic metal contact 316 completely surrounding each of the mesas, the scope of the invention also includes configurations wherein the ohmic contact is only disposed between some or all of the mesas or only partially surrounds each of the mesas.

Connections to the Schottky contacts and to the ohmic contact, such as solder bumps, are also provided. The solder bumps 320 or other interconnects are formed atop each of the atop part of the bond pad metal 312 of the mesas. Additional interconnects, such as solder bumps 322, may be provided at the edge of the bond pad metal 318 that is atop the ohmic contact or at other locations atop the layer 318.

Figure 4:
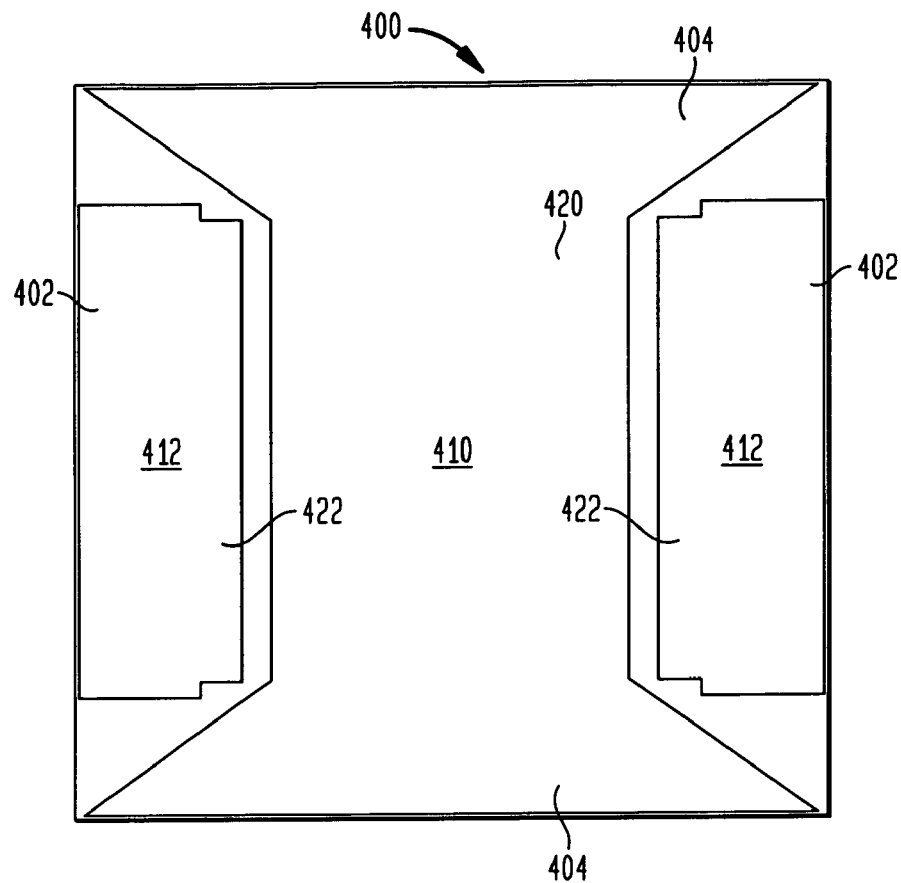
FIG. 4 is a top view on an enlarged scale of a submount structure in accordance with another embodiment of the invention.

FIG. 4 illustrates a submount structure 400 according to another embodiment of the invention. The submount structure is suitable for mounting a Schottky diode, such as the arrangement shown in FIGS. 3A and 3B, in a flip chip arrangement. The submount structure 400 includes a contact 410 which includes a contact region 420 to which some or all of the bond pad metal 312 atop the Schottky contacts are connected via interconnects, such as the solder bumps 320. The contact 410 also includes terminal regions 404 to provide connections external to the submount. Further contacts 412 include contact regions 422 to which the bond pad 318 atop the ohmic contact is connected via further interconnects, such as the solder bumps 322. Terminals 402 are also provided for connections external to the submount.

The flip chip assembly of the Schottky diode 300 and the submount 400 reduces the spreading resistances of the Schottky and ohmic contacts, thereby further reducing the forward voltage drop in the device.

Though the solder bumps 322 or other interconnects shown in FIG. 3B are located at the edge of the ohmic region, the invention also includes other arrangements. The solder bumps or other interconnects to the ohmic contact may be located between some of the mesas. Alternatively, interconnects are located between some of the mesas as well as at the edge of the device. The configuration of the contacts 400 and 420 is then arranged accordingly.

Figure 5:
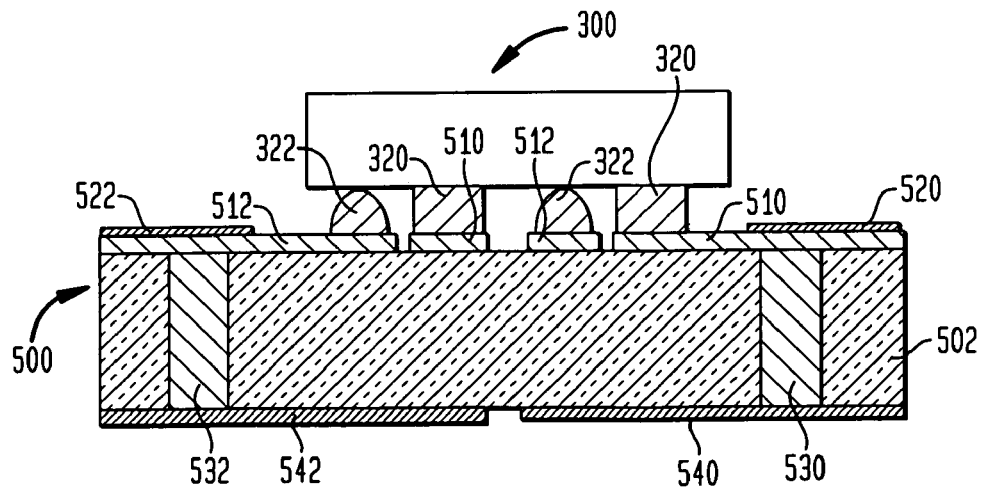
FIG. 5 is a cross-sectional view on an enlarged scale of a submount structure in accordance with a further embodiment of the invention having a laterally conducting Schottky diode of a still further embodiment of the invention mounted thereon in a flip chip arrangement.

FIG. 5 illustrates such an alternative embodiment of the invention in which solder bumps 322 or other interconnects are located between some of the mesas as well as at the edge of the ohmic contact. Additionally, the external terminals are located at the bottom of the submount rather than at the top.

The Schottky contacts are connected via the solder bumps 320 or other interconnects to contact regions 510 at the top surface of the submount substrate 502. The contact regions 510 are connected to a common contact 520 which is connected to a terminal 540 located at the bottom of the submount substrate by one or more vias 530. The solder bumps 322 or other interconnects connect the ohmic contact of the Schottky diode to further contact regions 512 which are connected to a further common contact 522. The further common contact 522 is connected to an terminal 542 on the backside of the substrate by one or more further vias 532. The provision of the terminals on the backside of the submount 500 provides for an external connection that is isolated from the Schottky diode.

Additionally, to prevent arcing between the Schottky contact and the ohmic contact, an insulating passivation layer (not shown) may be deposited atop the Schottky diode prior to mounting on the substrate which electrically isolates the Schottky contact and its interconnect from the ohmic contact and its interconnect. Alternatively, portions of the top surface of the submount may be raised to isolate the Schottky contact from the ohmic contact.

The flip chip arrangements of the invention have the added advantage that when a thermally conductive submount material is used, such as silicon, aluminum nitride (AlN) or an electrically isolated metal, the submount also transports heat from the Schottky diode, thereby alleviating heat buildup at the thermally insulating substrate of the Schottky diode.

Figure 6A:
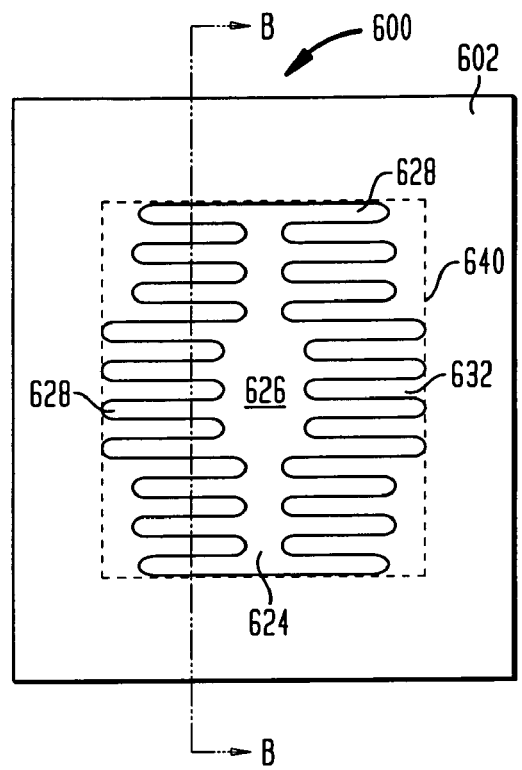
FIG. 6A is a top view on an enlarged scale of a laterally conducting Schottky diode in accordance with yet another aspect of the invention.

FIG. 6A illustrates still another embodiment of the invention showing a Schottky diode 600 that is optimized to reduce the length of the conduction path as well as reduce the current spreading at the edge of the Schottky contact. A plurality of finger-shaped mesas 628 intersect either with a central mesa 626 or with a bridge mesa 624 that, in turn, intersects with the central mesa 626. One or more Schottky contacts are formed atop the finger-shaped mesas 628, the bridge mesas 624 and the central mesa 626. One or more ohmic contacts 632 are formed between some or all of the finger shaped mesas 628 and reduce the current path between the Schottky contact and the ohmic contact. The central mesa 626 may serve as a bonding pad region to an external submount, such as in the flip chip configuration described above.

Figure 6B:
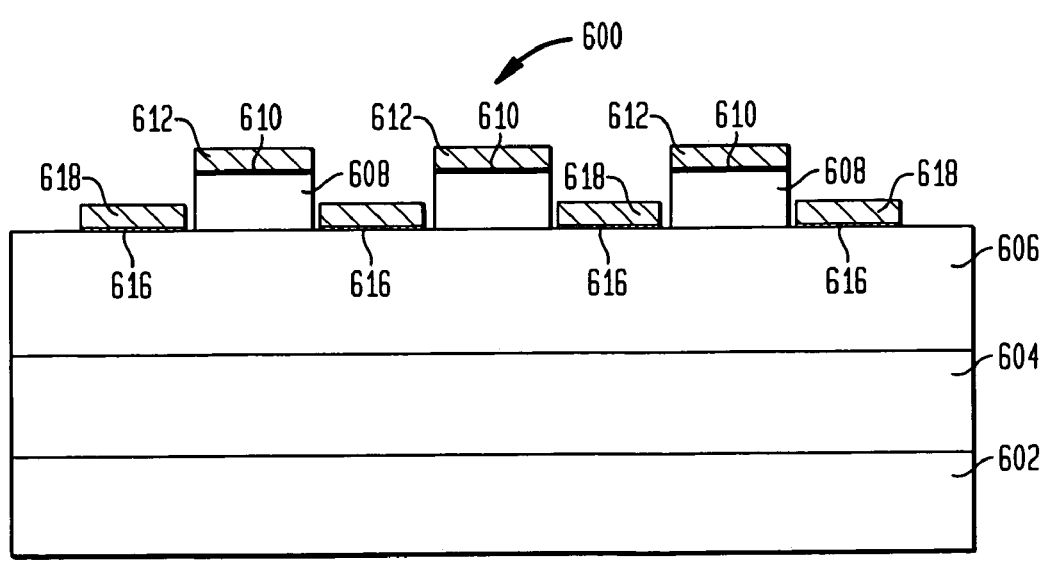
FIG. 6B is a fragmentary cross-sectional view of the device shown in FIG. 6A.

FIG. 6B illustrates a cross-sectional view of the Schottky diode shown in FIG. 6A taken along line B—B. A heavily doped layer 606 is formed atop an insulating substrate 602 and atop an optional buffer region 604 in the manner described above with reference to FIG. 3A. Additionally, a lower doped layer 608 is formed as described above and is etched in a known manner to form the intersecting finger-shaped mesas 628, the bridge mesas 624 and central mesa 626 shown in FIG. 6A. A Schottky contact 610 is formed atop some or all of the mesas of lower doped layer, and a bond pad metal layer 612 is formed atop the Schottky contact 610. One or more ohmic contacts 616 are formed atop the lower doped layer 606, and a bond pad metal 618 is formed atop the one or more ohmic contacts 616. The ohmic contact 616 and bond pad metal 618 are disposed between some or all the finger-shaped mesas 628 in an interdigitated manner to reduce the current path length. The Schottky contact 610, the ohmic contact 616 and the bond pad metal 618 may be comprised of the materials described above with reference to FIG. 3A.

Advantageously, the dimensions of the finger-shaped mesas 628, such as the perimeter, length, width, and/or the length-to-width ratio, may be optimized for a given doping concentration and thickness of the lower doped layer 606 to reduce the current path length as well as reduce the current crowding effect at the edge of the Schottky contact, thereby reducing the forward resistance of the device. The length-to-width ratio is at least about 2:1 but is preferably from about 7:1 to about 10:1 when optimized as described above. Additionally, the perimeter of the finger-shaped regions may be optimized to further optimize the current path length and current spreading. The perimeter of the combined structure is at least twice that of an imaginary rectangle 640 drawn around the structure but is preferably from about four to ten times that of the imaginary perimeter when similarly optimized. As a result, the forward resistance of the device is reduced.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A Schottky diode, comprising:
    a semiconductor body including a lower semiconductor layer and an upper semiconductor layer formed atop a portion of said lower semiconductor layer, said lower semiconductor layer and said upper semiconductor layer being of a same conductivity type, said lower semiconductor layer being more highly doped than said upper semiconductor layer, said semiconductor body defining a lower contact surface and a plurality of mesas projecting upwardly from said lower contact surface, said lower contact surface including at least a portion of said lower layer, each of said plurality of mesas including a portion of said upper layer and defining an upper contact surface, each of said plurality of mesas being separated from adjacent ones of said plurality of mesas by a portion of said lower contact surface;

a plurality of upper metallic contacts each disposed atop a respective one of said plurality of mesas and forming a respective Schottky contact with the upper contact surface of that mesa; and one or more lower metallic contacts disposed on said lower contact surface in substantially ohmic contact therewith, at least part of said one or more lower metallic contacts extending between at least some of said plurality of mesas.

2. A Schottky diode as claimed in claim 1 wherein a size of each of said plurality of mesas is selected such that a forward operating voltage of said Schottky diode is minimized.

3. A Schottky diode as claimed in claim 1 wherein each of said plurality of mesas includes a portion of said lower layer.

4. A Schottky diode as claimed in claim 1 wherein each of said plurality of upper metallic contacts includes a contact metal layer that forms the respective Schottky contact with said upper contact surface and a bond pad metal layer that is disposed atop said contact metal layer.

5. A Schottky diode as claimed in claim 1 wherein each of said one or more lower metallic contacts includes a contact metal layer that forms the ohmic contact with said lower contact surface and a bond pad metal layer that is disposed atop said contact metal layer.

6. A Schottky diode as claimed in claim 1 wherein said one or more lower metallic contact regions includes one or more continuous regions, each such continuous region extending between two or more of said mesas.

7. A Schottky diode as claimed in claim 1 wherein at least one of said upper semiconductor layer and said lower semiconductor layer includes a nitride-based semiconductor.

8. A Schottky diode as claimed in claim 1 wherein at least one of said upper semiconductor layer and said lower semiconductor layer includes a gallium nitride-based semiconductor.

9. A Schottky diode as claimed in claim 1 wherein at least one of said upper semiconductor layer and said lower semiconductor layer includes GaN.

10. A Schottky diode as claimed in claim 1 wherein said lower semiconductor layer and said upper semiconductor layer are n-type.

11. A Schottky diode as claimed in claim 1 wherein at least some of said plurality of mesas intersect with at least another of said plurality of mesas and define a shape having a convoluted perimeter.

12. A Schottky diode as claimed in claim 11 wherein said perimeter of said shape is at least two times a perimeter of a smallest theoretical rectangle enclosing said shape.

13. A Schottky diode as claimed in claim 1 wherein at least some of said plurality of mesas intersect with at least another of said plurality of mesas and define a shape having a main portion and a plurality of extensions extending from said main portion, said plurality of extensions being interdigitated with regions of said lower contact surface.

14. A Schottky diode as claimed in claim 13 wherein said main portion is elongated at least in a first direction and at least some of said plurality of extensions are elongated in a second direction transverse to said first direction.

15. A Schottky diode as claimed in claim 13 wherein at least some of said plurality of extensions have length-to-width ratios of at least about 2:1.

16. A Schottky diode as claimed in claim 13 wherein at least one of said plurality of upper metallic contacts is disposed atop said main portion.

17. A Schottky diode as claimed in claim 13 wherein at least some of said plurality of upper metallic contacts are disposed atop at least some of said plurality of extensions and are electrically connected with one another, and said at least part of said one or more lower metallic contacts extends between at least said some of said plurality of extensions.

18. A Schottky diode as claimed in claim 13 wherein a length-to-width ratio of at least some of said plurality of extensions is selected such that a forward operating voltage of said Schottky diode is minimized.

19. A Schottky diode as claimed in claim 1 wherein at least some of said plurality of mesas intersect with at least another of said plurality of mesas and define a shape having a main portion, at least one bridge extending from said main portion and a plurality of extensions extending from said bridge; said plurality of extensions being interdigitated with regions of said lower contact surface.

20. A Schottky diode as claimed in claim 19 wherein said main portion and said bridge are elongated at least in a first direction and at least some of said extensions are elongated in a second direction transverse to said first direction.

21. A Schottky diode as claimed in claim 19 wherein at least some of said extensions have length-to-width ratios of at least about 2:1.

22. A Schottky diode as claimed in claim 19 wherein at least one of said plurality of upper metallic contacts is disposed atop said main portion.

23. A Schottky diode as claimed in claim 19 wherein at least some of said plurality of upper metallic contacts are disposed atop at least some of said plurality of extensions and are electrically connected with one another, and said at least part of said one or more lower metallic contacts extends between at least said some of said plurality of extensions.

24. A Schottky diode as claimed in claim 19 wherein a length-to-width ratio of at least some of said plurality of extensions is selected such that a forward operating voltage of said Schottky diode is minimized.

25. A diode assembly including: a Schottky diode as claimed in claim 1, one or more first conductors electrically connected to at least some of said plurality of upper metallic contacts and one or more second conductors electrically connected to one or more of said one or more lower metallic contacts.

26. A diode assembly as claimed in claim 25 wherein said one or more first conductors are electrically connected to all of said upper metallic contacts, and said one or more second conductors are electrically connected to all of said one or more lower metallic contacts.

27. A diode assembly as claimed in claim 26 wherein one or more second conductors are electrically connected to each said one or more continuous regions at a plurality of spaced-apart connection points.

28. A diode assembly as claimed in claim 27 wherein at least some of said connection points are disposed away from said mesas.

29. A diode assembly as claimed in claim 28 wherein at least some of said connection points are disposed between at least some of said mesas.

30. A diode assembly as claimed in claim 25 wherein said one or more first conductors and said one or more second conductors include interconnect bumps.

31. A diode assembly as claimed in claim 25 further comprising a submount structure including:
a submount substrate,
one or more first submount contacts, each such one or more first submount contacts being electrically connected to one or more of said one or more said first conductors and exposed at a front surface of said submount substrate, and
one or more second submount contact pads, each such one or more second submount contact pads being electrically connected to one or more of said one or more second conductors and exposed at said front surface of said submount substrate;
said semiconductor body being mounted on said front surface of said submount substrate in a flip-chip arrangement such that said first submount contacts are connected to said upper contacts and said second submount contacts are connected to said one or more lower contacts.

32. A diode assembly as claimed in claim 31 wherein said submount structure includes a first terminal and a second terminal each disposed on said front surface of said submount substrate and configured to provide connections external to said assembly, each said one or more first submount contacts being electrically connected to said first terminal, and each said one or more second submount contacts being electrically connected to said second terminal.

33. A diode assembly as claimed in claim 31 wherein said submount structure includes a first terminal and a second terminal each disposed on a back surface of said submount substrate and configured to provide connections external to said assembly, each said one or more first submount contacts being electrically connected to said first terminal, and each said one or more second submount contacts being electrically connected to said second terminal.

34. A diode assembly as claimed in claim 33 wherein said submount structure includes at least a first conducting via that extends through said submount substrate and electrically connects each said one or more first submount contacts with said first terminal, and at least a second conducting via that extends through said submount substrate and electrically connects each said one or more second submount contacts with said second terminal.

35. A diode assembly as claimed in claim 34 wherein said submount structure includes a first common terminal and a second common terminal each disposed on said front surface of said submount substrate, said first common terminal electrically connecting each said one or more first submount contacts to said first conducting via, said second common terminal electrically connecting each said one or more second submount contacts to said second conducting via.

36. A Schottky diode as claimed in claim 1 wherein a length-to-width ratio of at least some of said plurality of mesas is selected such that a forward operating voltage of said Schottky diode is minimized.

37. A Schottky diode, comprising:
a semiconductor body including a lower semiconductor layer and an upper semiconductor layer formed atop a portion of said lower semiconductor layer, said lower semiconductor layer and said upper semiconductor layer being of the same conductivity type, said lower semiconductor layer being more highly doped than said upper semiconductor layer, said semiconductor body defining a lower contact surface and a plurality of mesas projecting upwardly from said lower contact surface, said lower contact surface including a portion of said lower layer, each of said plurality of mesas including a portion of said upper layer and a further portion of said lower layer, each of said plurality of mesas defining an upper contact surface and being separated from adjacent ones of said plurality of mesas by a portion of said lower contact surface;
a plurality of upper metallic contacts each disposed atop a respective one of said plurality of mesas and forming a respective Schottky contact with the upper contact surface of that mesa; and
one or more lower metallic contacts disposed on said lower contact surface in substantially ohmic contact therewith.

38. A Schottky diode as claimed in claim 37 wherein a size of each of said plurality of mesas is selected such that a forward operating voltage of said Schottky diode is minimized.

39. A Schottky diode as claimed in claim 37 wherein the distance between a top surface of said one or more lower metallic contacts and said lower contact surface is less than the distance between a bottom surface of said upper layer and said lower contact surface.

40. A Schottky diode as claimed in claim 37 wherein each of said plurality of upper metallic contacts includes a contact metal layer that forms the respective Schottky contact with said upper contact surface and a bond pad metal layer that is disposed atop said contact metal layer.

41. A Schottky diode as claimed in claim 37 wherein each of said one or more lower metallic contacts includes a contact metal layer that forms the ohmic contact with said lower contact surface and a bond pad metal layer that is disposed atop said contact metal layer.

42. A Schottky diode as claimed in claim 37 wherein at least one of said upper semiconductor layer and said lower semiconductor layer includes a nitride-based semiconductor.

43. A Schottky diode as claimed in claim 37 wherein at least one of said upper semiconductor layer and said lower semiconductor layer includes a gallium nitride-based semiconductor.

44. A Schottky diode as claimed in claim 37 wherein at least one of said upper semiconductor layer and said lower semiconductor layer includes GaN.

45. A Schottky diode as claimed in claim 37 wherein said lower semiconductor layer and said upper semiconductor layer are n-type.

46. A Schottky diode as claimed in claim 37 wherein at least some of said plurality of mesas intersect with at least another of said plurality of mesas and define a shape having a convoluted perimeter.

47. A Schottky diode as claimed in claim 46 wherein said perimeter of said shape is at least two times a perimeter of a smallest theoretical rectangle enclosing said shape.

48. A Schottky diode as claimed in claim 37 wherein at least some of said plurality of mesas intersect with at least another of said plurality of mesas and define a shape having a main portion and a plurality of extensions extending from said main portion, said plurality of extensions being interdigitated with regions of said lower contact surface.

49. A Schottky diode as claimed in claim 48 wherein said main portion is elongated at least in a first direction and at least some of said plurality of extensions are elongated in a second direction transverse to said first direction.

50. A Schottky diode as claimed in claim 48 wherein at least some of said plurality of extensions have length-to-width ratios of at least about 2:1.

51. A Schottky diode as claimed in claim 48 wherein at least one of said plurality of upper metallic contacts is disposed atop said main portion.

52. A Schottky diode as claimed in claim 48 wherein at least some of said plurality of upper metallic contacts are disposed atop at least some of said plurality of extensions and are electrically connected with one another, and said at least part of said one or more lower metallic contacts extends between at least said some of said plurality of extensions.

53. A Schottky diode as claimed in claim 48 wherein a length-to-width ratio of at least some of said plurality of extensions is selected such that a forward operating voltage of said Schottky diode is minimized.

54. A Schottky diode as claimed in claim 37 wherein at least some of said plurality of mesas intersect with at least another of said plurality of mesas and define a shape having a main portion, at least one bridge extending from said main portion and a plurality of extensions extending from said bridge; said plurality of extensions being interdigitated with regions of said lower contact surface.

55. A Schottky diode as claimed in claim 54 wherein said main portion and said bridge are elongated at least in a first direction and at least some of said extensions are elongated in a second direction transverse to said first direction.

56. A Schottky diode as claimed in claim 54 wherein at least some of said extensions have length-to-width ratios of at least about 2:1.

57. A Schottky diode as claimed in claim 54 wherein at least one of said plurality of upper metallic contacts is disposed atop said main portion.

58. A Schottky diode as claimed in claim 54 wherein at least some of said plurality of upper metallic contacts are disposed atop at least some of said plurality of extensions and are electrically connected with one another, and said at least part of said one or more lower metallic contacts extends between at least said some of said plurality of extensions.

59. A Schottky diode as claimed in claim 54 wherein a length-to-width ratio of at least some of said plurality of extensions is selected such that a forward operating voltage of said Schottky diode is minimized.

60. A diode assembly including: a Schottky diode as claimed in claim 37, one or more first conductors electrically connected to at least some of said plurality of upper metallic contacts and one or more second conductors electrically connected to one or more of said one or more lower metallic contacts.

61. A diode assembly as claimed in claim 60 wherein said one or more first conductors are electrically connected to all of said upper metallic contacts, and said one or more second conductors are electrically connected to all of said one or more lower metallic contacts.

62. A diode assembly as claimed in claim 61 wherein one or more second conductors are electrically connected to each said one or more continuous regions at a plurality of spaced-apart connection points.

63. A diode assembly as claimed in claim 62 wherein at least some of said connection points are disposed away from said mesas.

64. A diode assembly as claimed in claim 63 wherein at least some of said connection points are disposed between at least some of said mesas.

65. A diode assembly as claimed in claim 60 wherein said one or more first conductors and said one or more second conductors are interconnect bumps.

66. A diode assembly as claimed in claim 60 further comprising a submount structure including:
   a submount substrate,
   one or more first submount contacts, each such one or more first submount contacts being electrically connected to one or more of said one or more said first conductors and exposed at a front surface of said submount substrate, and
   one or more second submount contact pads, each such one or more second submount contact pads being electrically connected to one or more of said one or more second conductors and exposed at said front surface of said submount substrate;
   said semiconductor body being mounted on said front surface of said submount substrate in a flip-chip arrangement such that said first submount contacts are connected to said upper contacts and said second submount contacts are connected to said one or more lower contacts.

67. A diode assembly as claimed in claim 66 wherein said submount structure includes a first terminal and a second terminal each disposed on said front surface of said submount substrate and configured to provide connections external to said assembly, each said one or more first submount contacts being electrically connected to said first terminal, and each said one or more second submount contacts being electrically connected to said second terminal.

68. A diode assembly as claimed in claim 66 wherein said submount structure includes a first terminal and a second terminal each disposed on a back surface of said submount substrate and configured to provide connections external to said assembly, each said one or more first submount contacts being electrically connected to said first terminal, and each said one or more second submount contacts being electrically connected to said second terminal.

69. A diode assembly as claimed in claim 68 wherein said submount structure includes at least a first conducting via that extends through said submount substrate and electrically connects each said one or more first submount contacts with said first terminal, and at least a second conducting via that extends through said submount substrate and electrically connects each said one or more second submount contacts with said second terminal.

70. A diode assembly as claimed in claim 69 wherein said submount structure includes a first common terminal and a second common terminal each disposed on said front surface of said submount substrate, said first common terminal electrically connecting each said one or more first submount contacts to said first conducting via, said second common terminal electrically connecting each said one or more second submount contacts to said second conducting via.

71. A Schottky diode as claimed in claim 37 wherein a length-to-width ratio of at least some of said plurality of mesas is selected such that a forward operating voltage of said Schottky diode is minimized.

72. A submount structure, comprising:
   a submount substrate;
   two or more first submount contacts, each of said two or more first submount contacts being exposed at a front surface of said submount substrate;
   a first common terminal disposed on said front surface of said submount substrate, said first common terminal being electrically connected to said each of said two or more first submount contacts;
   a first conducting via extending from said front surface of said submount substrate to a back surface of said submount substrate, said first conducting via being electrically connected to said first common terminal;

a first further terminal disposed on said back surface of said submount substrate and configured to provide connections external to said submount structure, said first further terminal being electrically connected to said first conducting via and thereby being electrically connected to said each of said two or more first submount contacts;

one or more second submount contact pads, each such one or more second submount contact pads exposed at said front surface of said submount substrate;

a second common terminal disposed on said front surface of said submount substrate, said second common terminal being electrically connected to said each one or more second submount contacts;

at least a second conducting via extending from said front surface of said submount substrate to said back surface of said submount substrate, said second conducting via being electrically connected to said second common terminal; and a second further terminal disposed on said back surface of said submount substrate and configured to provide connections external to said submount structure, said second further terminal being electrically connected to said second conducting via.

73. A Schottky diode, comprising:

a semiconductor body including a lower semiconductor layer and an upper semiconductor layer formed atop a portion of said lower semiconductor layer, said lower semiconductor layer and said upper semiconductor layer being of a same conductivity type, said lower semiconductor layer being more highly doped than said upper semiconductor layer, said semiconductor body defining a lower contact surface and a first mesa projecting upwardly from said main surface, said first mesa including at least a portion of said upper layer and defining an upper contact surface, said first mesa having a main portion, at least one bridge extending from said main portion, and a plurality of extensions extending from said main portion or from said bridge, said plurality of extensions being interdigitated with regions of said lower contact surface, said main portion and said bridge being elongated at least in a first direction and at least some of said extensions being elongated in a second direction transverse to said first direction, at least some of said extensions have length-to-width ratios of at least about 2:1;

one or more upper metallic contacts disposed atop said first mesa and forming a Schottky contact with the upper contact surface of said first mesa; and one or more lower metallic contacts disposed on said lower contact surface in substantially ohmic contact therewith, at least part of said one or more lower metallic contacts extending between at least some of said plurality of extensions.

74. A Schottky diode as claimed in claim 73 wherein said first mesa has a perimeter at least two times the perimeter of a smallest theoretical rectangle enclosing said first mesa.

75. A Schottky diode as claimed in claim 73 wherein at least one of said upper semiconductor layer and said lower semiconductor layer includes a nitride-based semiconductor.

76. A Schottky diode as claimed in claim 73 wherein at least one of said upper semiconductor layer and said lower semiconductor layer includes a gallium nitride-based semiconductor.

77. A Schottky diode as claimed in claim 73 wherein at least one of said upper semiconductor layer and said lower semiconductor layer includes GaN.

* * * * *